United States Patent
Park

(10) Patent No.: US 7,271,017 B2
(45) Date of Patent: Sep. 18, 2007

(54) ORGANIC ELECTROLUMINESCENT DISPLAY DEVICE AND FABRICATING METHOD THEREOF

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 251 days.

(21) Appl. No.: 11/019,628

(22) Filed: Dec. 23, 2004

(65) Prior Publication Data

US 2005/0140307 A1   Jun. 30, 2005

(30) Foreign Application Priority Data

Dec. 30, 2003   (KR)   .................... 10-2003-0100604

(51) Int. Cl.
  *H01L 21/00*   (2006.01)
(52) U.S. Cl. .................. 438/20; 438/21; 438/155; 257/211; 257/E27.114; 257/E27.117; 345/76; 345/92; 315/169.1; 315/169.3
(58) Field of Classification Search .. 315/169.1–169.3; 345/76, 82, 84, 92; 257/40, 448, E27.111, 257/E27.114, E27.117, 211; 313/506, 509; 438/20, 21, 33, 155
See application file for complete search history.

(56) References Cited

U.S. PATENT DOCUMENTS 6,175,345 B1   1/2001   Kuribayashi et al. ......... 345/76

| 6,476,897 | B1* | 11/2002 | Watanabe et al. ........... 349/139 |
| 6,548,961 | B2 | 4/2003 | Barth et al. ............... 315/169.3 |
| 6,919,215 | B2* | 7/2005 | Yamazaki et al. ............. 438/21 |
| 6,946,791 | B2* | 9/2005 | Choi et al. ................... 313/506 |
| 6,979,956 | B2* | 12/2005 | Park et al. ................ 315/169.3 |
| 7,221,425 | B2* | 5/2007 | Jung et al. ................... 349/149 |
| 2002/0158577 | A1 | 10/2002 | Shimoda et al. ............ 313/506 |
| 2005/0140305 | A1* | 6/2005 | Kim ......................... 315/169.3 |

FOREIGN PATENT DOCUMENTS

| JP | 2001-177509 | 4/2001 |
| KR | 2002-0047889 | 6/2002 |
| KR | 2003-0075771 | 9/2003 |
| KR | 2004-0079476 | 9/2004 |
| WO | WO-02/078101 | 10/2005 |

* cited by examiner

*Primary Examiner*—Haissa Philogene
(74) *Attorney, Agent, or Firm*—Morgan, Lewis & Bockius LLP

(57) ABSTRACT

An electroluminescent display device includes first and second substrates facing each other, data and gate lines crossing each other on the first substrate to define a plurality of pixel regions, a switching transistor connected to the gate and data lines, a driving transistor connected to the switching transistor, a dummy pattern on the first substrate, a connection electrode on the dummy pattern and connected to the driving transistor, a power line connected to the driving transistor, and an emitting diode on the second substrate and connected to the connection electrode.

35 Claims, 13 Drawing Sheets

ORGANIC ELECTROLUMINESCENT DISPLAY DEVICE AND FABRICATING METHOD THEREOF

The present invention claims the benefit of Korean Patent Application No. 2003-100604 filed in Korea on Dec. 30, 2003, which is hereby incorporated by reference.

BACKGROUND OF THE INVENTION

1. Field of the Invention

The present invention relates to a display device and a method of fabricating a display device, and more particularly, to an organic electroluminescent display (OELD) device and a method of fabricating an OELD device.

2. Discussion of the Related Art

Until recently, many display devices employed cathode-ray tubes (CRTs) to display images. However, various types of flat panel displays, such as liquid crystal display (LCD) devices, plasma display panel (PDP) devices, field emission display (FED) devices, and electro-luminescent display (ELD) devices, are currently being developed as substitutes for the CRTs. Among these various types of flat panel displays, the PDP devices have advantages of large display size, but have disadvantages of low lightness and high power consumption. Similarly, the LCD devices have advantages of thin profile and low power consumption, but have disadvantages of small display size. However, the OELD devices are luminescent displays having advantages of fast response time, high brightness, and wide viewing angles.

FIG. 1 is a cross sectional view of an OELD device according to the related art. In FIG. 1, an OELD 10 includes first and second substrates 12 and 28 facing each other and bonded together with a sealant 26. The first substrate 12 includes a transistor T, a first electrode 16 within a pixel region P, an organic emitting layer 18, and a second electrode 20. Each of the organic emitting layers 18 has red (R), green (G), or blue (B) emitting material layers. The first and second electrodes 16 and 20 together with the organic emitting layer 18 constitute an organic emitting diode. The second substrate 28 has a recessed portion 92 filled with a desiccant 94 for blocking entry of outer moisture.

In FIG. 1, when the first electrode 16 is formed of a transparent material, light emitted from the organic emitting layer 18 is transmitted toward the first substrate 12. Thus, the OELD is catagorized as a bottom emission-type OELD.

FIG. 2 is a view of an equivalent circuit for an OELD device according to the related art. In FIG. 2, a data line 49 and a gate line 36 cross each other to define a pixel region. In addition, the OELD device includes a power line 62, a switching transistor $T_S$, a driving transistor $T_D$, a storage capacitor Cst, and an organic emitting diode E. The switching transistor $T_S$ turns ON or OFF depending upon a gate signal supplied along the gate line 36. When the switching transistor $T_S$ is turned ON, a data signal is supplied to the driving transistor $T_D$ through the data line 49. Similarly, the driving transistor $T_D$ turns ON or OFF depending on the supplied data signal. When the driving transistor $T_D$ is turned ON, a power signal is supplied to the organic emitting diode E through the power line 62, and thus the organic emitting diode E emits light.

In FIG. 2, since the switching and driving transistors $T_S$ and $T_D$ and the organic emitting diode E are both formed on the first (lower) substrate 12 (in FIG. 1), production efficiency of the OELD device is reduced. For example, if one of the switching and driving transistors $T_S$ and $T_D$ and the organic emitting diode E is determined to be unacceptable after fabrication, then the first (lower) substrate 12 (in FIG. 1) is considered to be unacceptable, and thus the production efficiency of the OELD device is reduced. Furthermore, when the first electrode of the organic emitting diode E is formed of a transparent material, the OELD device functions as the bottom emission-type OELD. Accordingly, since the switching and driving transistors $T_S$ and $T_D$ and metal lines block bottom emission of the light, aperture ratio of the OELD device is reduced, and high resolution is difficult to achieve.

SUMMARY OF THE INVENTION

Accordingly, the present invention is directed to an OELD device and a method of fabricating an OELD device that substantially obviate one or more of problems due to limitations and disadvantages of the related art.

An object of the present invention is to provide an OELD device having an improved aperture ratio and high resolution.

Another object of the present invention is to provide a method of fabricating an OELD device having improved production efficiency and aperture ratio, and high resolution.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an electroluminescent display device includes first and second substrates facing each other, data and gate lines crossing each other on the first substrate to define a plurality of pixel regions, a switching transistor connected to the gate and data lines, a driving transistor connected to the switching transistor, a dummy pattern on the first substrate, a connection electrode on the dummy pattern and connected to the driving transistor, a power line connected to the driving transistor, and an emitting diode on the second substrate and connected to the connection electrode.

In another aspect, a method of fabricating an electroluminescent display device includes forming a dummy pattern on a first substrate, forming a gate line, first and second gate electrodes, and a first connection electrode formed on the dummy pattern, forming first and second insulating patterns on the first and second gate electrodes on the first substrate, respectively, forming first and second semiconductor patterns on the first and second insulating patterns, respectively, forming a data line crossing the gate line to define a pixel region, a power line, a first source electrode, and a first drain electrode on the first semiconductor pattern, and a second source electrode and a second drain electrode on the second semiconductor pattern, the first drain electrode contacts the second gate electrode and the second drain electrode contacts the connection electrode, forming a passivation layer having an opening to expose the first connection electrode, forming an emitting diode on a second substrate, and attaching the first and second substrates together.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the embodiments of the present invention, examples of which are illustrated in the accompanying drawings.

Figure 1:
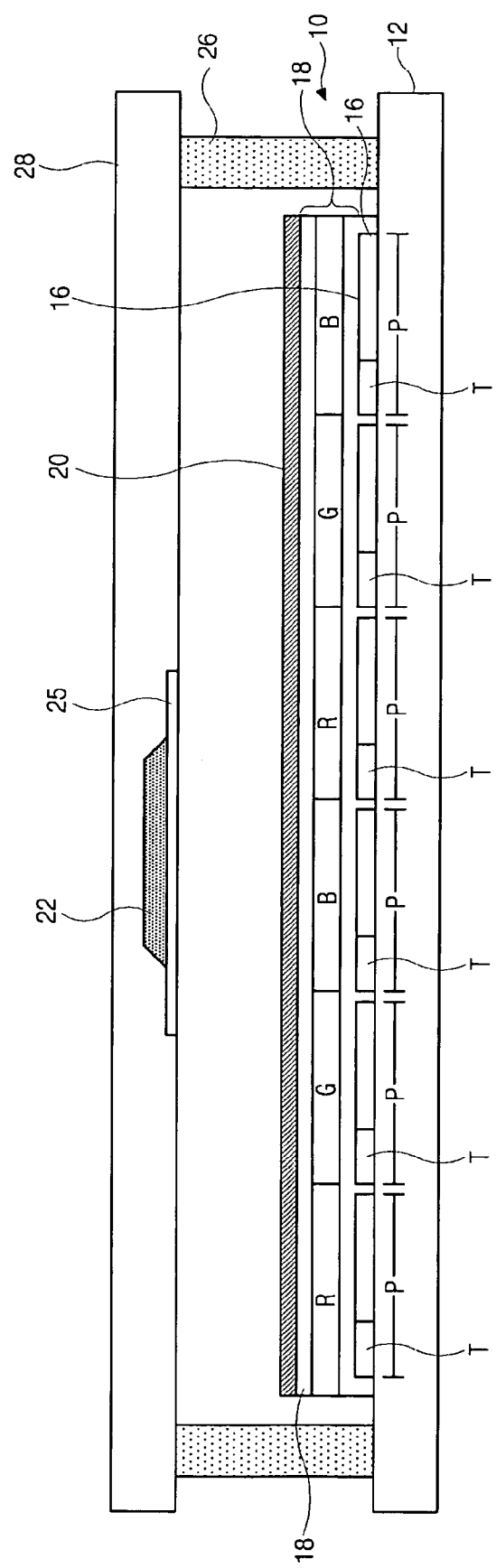
FIG. 1 is a cross sectional view of an OELD device according to the related art.
Figure 2:
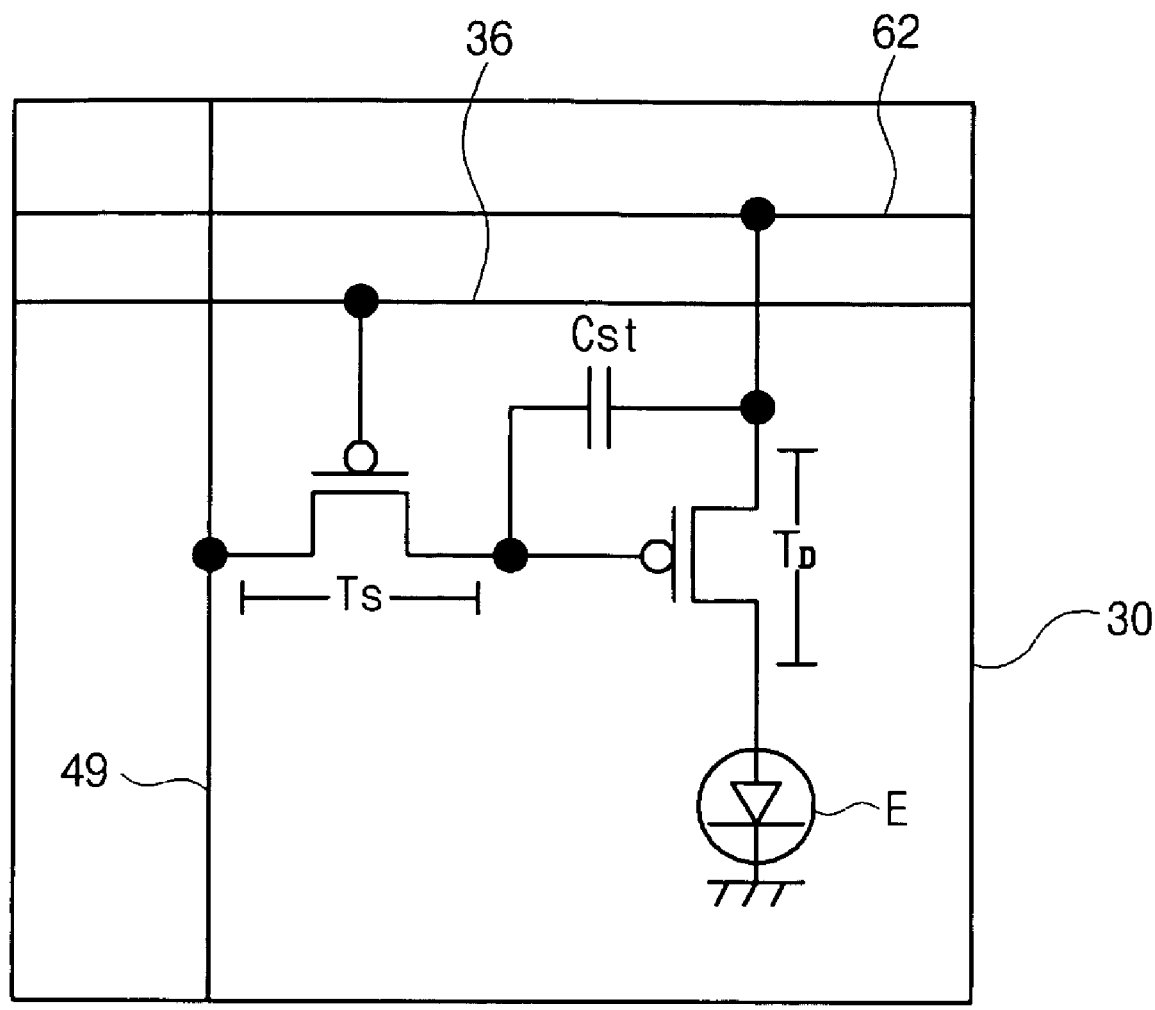
FIG. 2 is a view of an equivalent circuit for an OELD device according to the related art.
Figure 3:
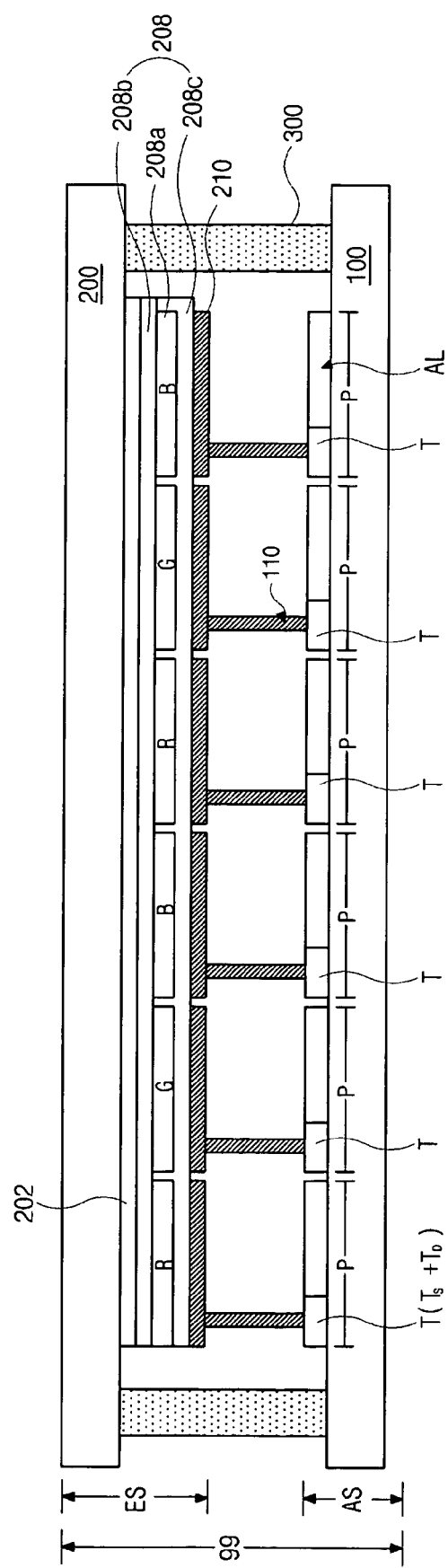
FIG. 3 is a cross sectional view of an exemplary OELD device according to the present invention.

FIG. 3 is a cross sectional view of an exemplary OELD device according to the present invention. In FIG. 3, an OELD device 99 may include an array substrate AS (i.e., a lower substrate) and an emitting substrate ES (i.e., an upper substrate) facing each other and bonded together by a sealant 300. The OELD device 99 may include a display region, and a non-display region disposed along peripheral portions of the display region. The display region is a region functioning to display images, and the non-display region is a region functioning to not display images. Accordingly, a plurality of pixel regions P are disposed within the display region.

In FIG. 3, the array substrate AS includes a transistor T having switching and driving transistors $T_S$ and $T_D$ and an array layer AL that has conductive patterns, such as gate and data lines, disposed on the inner surface of a first substrate 100. Accordingly, the transistor T may be disposed within each of the pixel regions P. The emitting substrate ES may include a first electrode 202, an organic emitting layer 208, and a second electrode 210 sequentially disposed on an inner surface of a second substrate 200. The organic emitting layer 208 may include an emitting material layer (EML) 208a, a hole injection layer (HIL) 208b disposed between the first electrode 202 and the emitting material layer 208a, and an electron injection layer (EIL) 208c disposed between the second electrode 210 and the emitting material layer 208a. In addition, the emitting material layer 208a may be disposed within each of the pixel regions P.

The emitting material layer 208a may include one of red (R), green (G), or blue (B) emitting material layers 208a depending upon the corresponding pixel region P. Although not shown, a hole transporting layer (HTL) may be disposed between the hole injection layer 208b and the emitting material layer 208a, and an electron transporting layer (ETL) may be disposed between the electron injection layer 208c and the emitting material layer 208a.

The first and second electrodes 202 and 210 may function as an anode and a cathode, respectively, whereby the first electrode 202 may have a work function greater than a work function of the second electrode 210. The first electrode 202 may be made of a transparent conductive material, such as indium-tin-oxide (ITO) and indium-zinc-oxide (IZO), and the second electrode 210 may be made of an opaque conductive material, such as one of calcium (Ca), aluminum (Al), and magnesium (Mg). Accordingly, the first electrode 202 may be disposed entirely within the display region, and the second electrode 210 may be disposed within each of the pixel regions P. In addition, a connection electrode 110 may be disposed between the transistor T and the second electrode 210 to electrically interconnect the transistor T and the second electrode 210.

Figure 4:
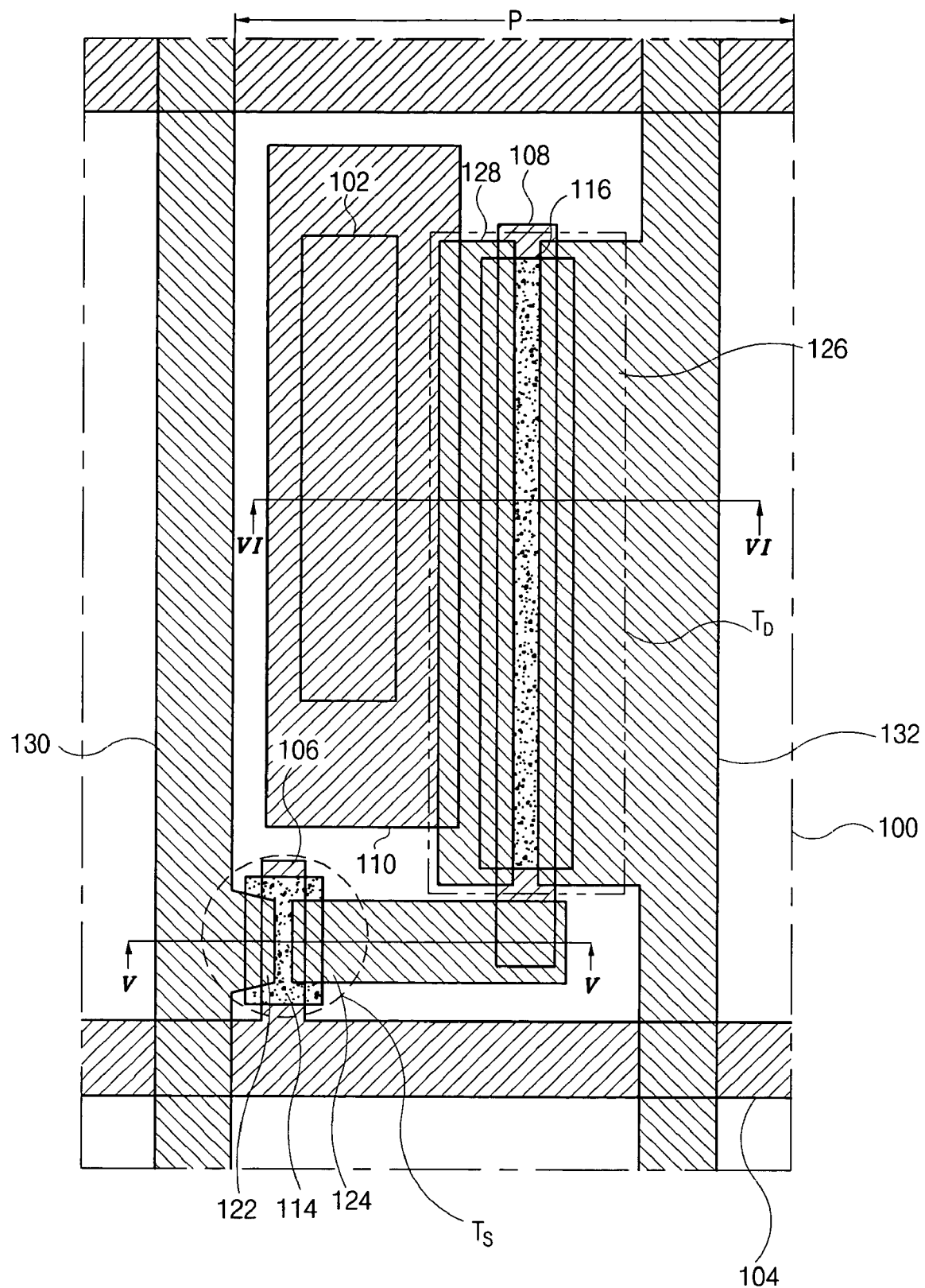
FIG. 4 is a plan view of an exemplary array substrate for an OELD device according to the present invention.

FIG. 4 is a plan view of an exemplary array substrate for an OELD device according to the present invention. In FIG. 4, gate and data lines 104 and 130 may be formed on a substrate 100 to cross each other, thereby defining a pixel region. In addition, a switching transistor $T_S$ may be disposed at the crossing of the gate and data lines 104 and 130, and may be electrically interconnected to the gate and data lines 104 and 130. Furthermore, a driving transistor $T_D$ may be connected with the switching transistor $T_S$, and a power line 132 may be disposed in parallel with the data line 130 to be connected to the driving transistor $T_D$.

In FIG. 4, the switching transistor $T_S$ may include a first gate electrode 106 connected to the gate line 104, a first source electrode 122 connected to the data line 130, a first drain electrode 124 spaced apart from the first source electrode 122, and a first semiconductor pattern 114. Similarly, the driving transistor $T_D$ may include a second gate electrode 108 connected to the first drain electrode 124, a second source electrode 126 connected to the power line 132, a second drain electrode 128 spaced apart from the second source electrode 126, and a second semiconductor pattern 116. In addition, a connection electrode 110 may be connected to the second drain electrode 128, and a dummy pattern 102 may be disposed below the connection electrode 110. Accordingly, since the dummy pattern 102 may have a projection shape, the connection electrode 110 covering the dummy pattern 102 may also have a projection shape.

Figure 5A:
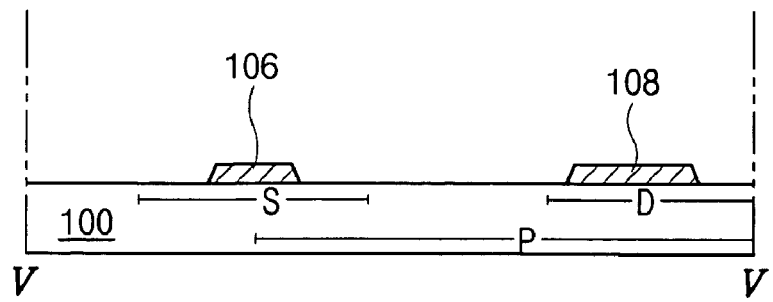
FIGS. 5A to 5D are cross-sectional views taken along V-V of FIG. 4 of an exemplary method of fabricating an array substrate for an OELD device according to the present invention.
Figure 5B:
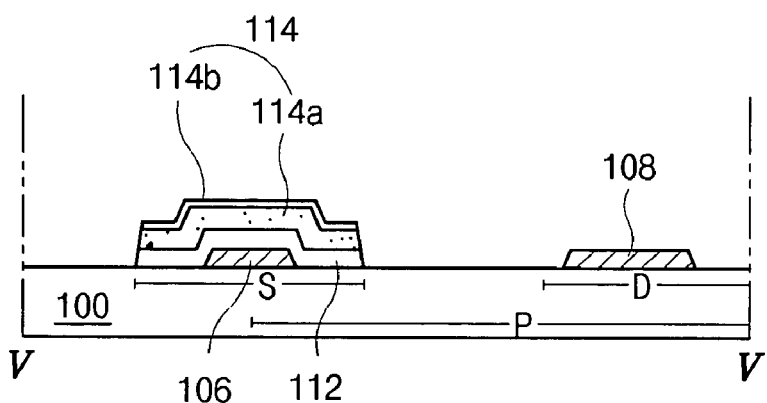
Figure 5C:
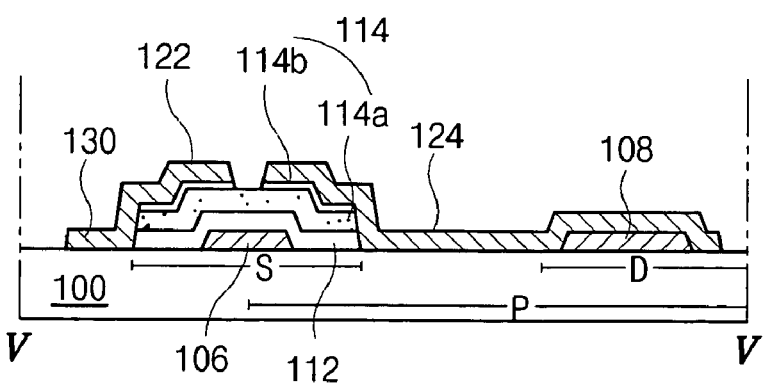
Figure 5D:
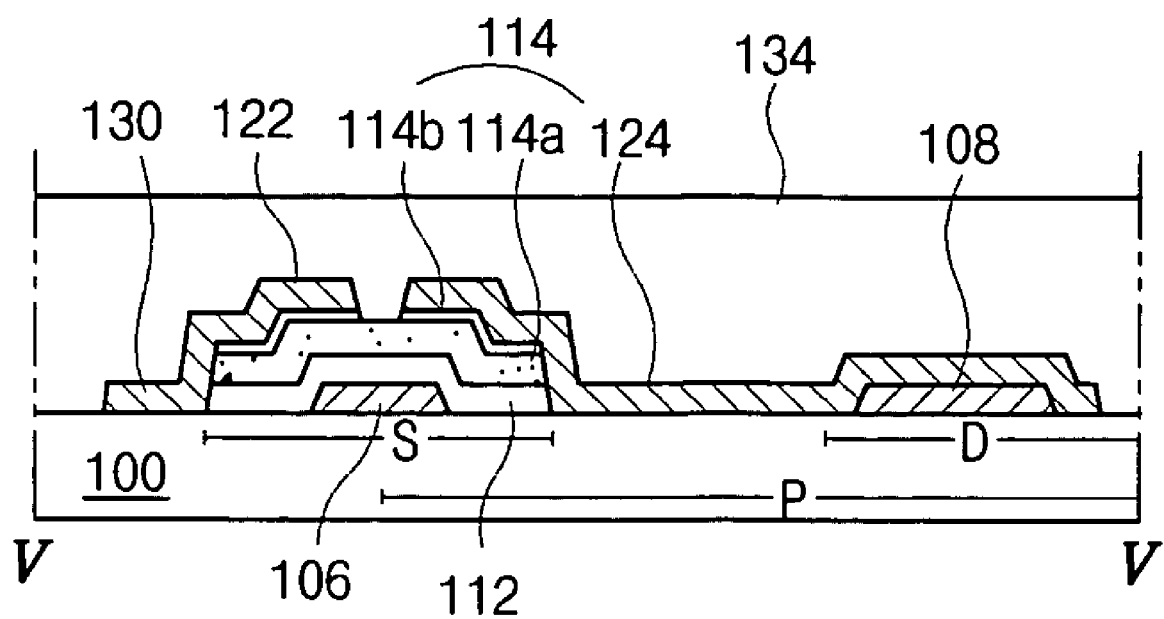
Figure 6A:
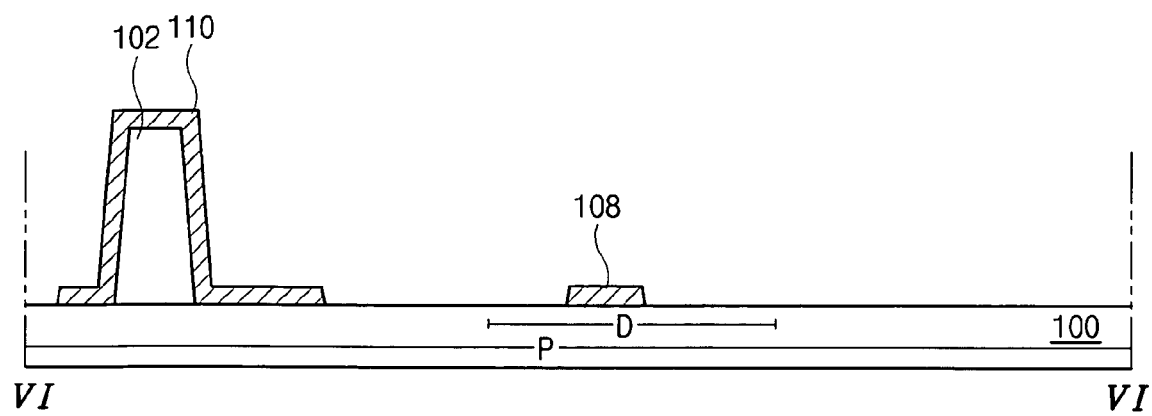
FIGS. 6A to 6D are cross sectional views taken along VI-VI of FIG. 4 of an exemplary method of fabricating an array substrate for an OELD device according to the present invention.

FIGS. 5A to 5D are cross-sectional views taken along V-V of FIG. 4 of an exemplary method of fabricating an array substrate for an OELD device according to the present invention, and FIGS. 6A to 6D are cross sectional views taken along VI-VI of FIG. 4 of an exemplary method of fabricating an array substrate for an OELD device according to the present invention. In FIGS. 5A and 6A, an organic material may be deposited on a substrate 100 having a pixel region P, a switching region S, and a driving region D. Then, the organic material may be patterned using a first mask process to form a dummy pattern 102 within the pixel region P. For example, the organic material may be made of acrylic material(s).

Next, a first metal may be deposited on the substrate 100 having the dummy pattern 102. Then, the first metal may be patterned using a second mask process to form a gate line 104 (in FIG. 4), first and second gate electrodes 106 and 108, and a connection electrode 110. Accordingly, the first and second gate electrodes 106 and 108 may be formed within the switching and driving regions S and D, respectively, and the connection electrode 110 may cover the dummy pattern 102. For example, the first metal may be made of one of aluminum (Al), aluminum alloy including aluminum neodymium (AlNd), tungsten (W), copper (Cu), molybdenum (Mo), and titanium (Ti).

Figure 6B:
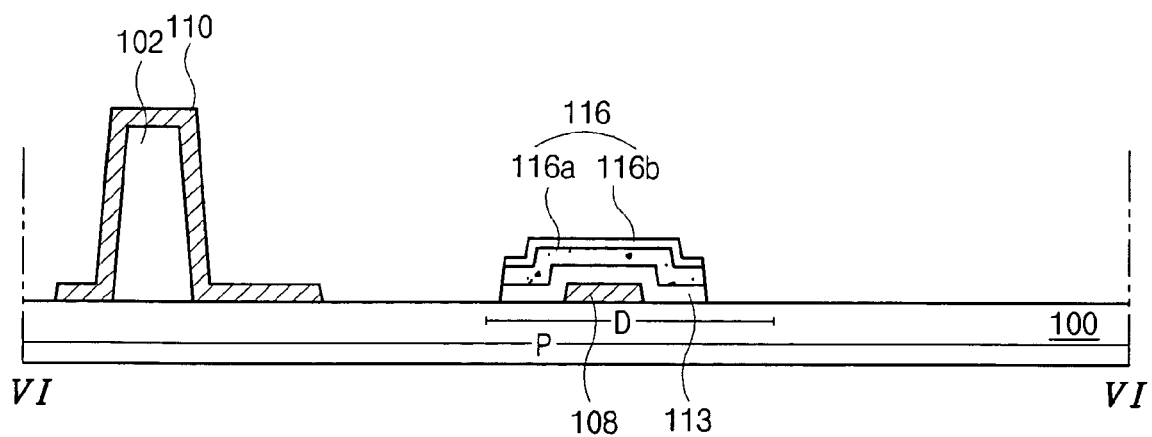

In FIGS. 5B and 6B, an insulating material, undoped amorphous silicon, and doped amorphous silicon may be sequentially deposited along an entire surface of the substrate 100 having the gate electrodes 106 and 108. Then, the insulating material, the undoped amorphous silicon, and the doped amorphous silicon may be patterned using a third mask process to form first and second semiconductor patterns 114 and 116. Accordingly, the first semiconductor pattern 114 may be formed within the switching region S, and the second semiconductor pattern 116 may be formed within the driving region D. In addition, the first semiconductor pattern 114 may include a first active layer 114a formed of the undoped (or intrinsic) amorphous silicon and a first ohmic contact layer 114b formed of the doped amorphous silicon. Similarly, the second semiconductor pattern 116 may include a second active layer 116a formed of the undoped (or intrinsic) amorphous silicon and a second ohmic contact layer 116b formed of the doped amorphous silicon.

During the third mask process, the insulating material may be simultaneously patterned with the semiconductor patterns 114 and 116 to form first and second gate insulating patterns 112 and 113, which may be below the first and second semiconductor patterns 114 and 116, respectively. Accordingly, the gate insulating patterns 112 and 113 may have similar patterned shapes along a plane with the semiconductor patterns 114 and 116. The gate insulating patterns 112 and 113 may be made of an inorganic insulating material, such as silicon nitride ($SiN_x$) and silicon oxide ($SiO_2$). In addition, the insulating material, the undoped (or intrinsic) amorphous silicon, and the doped amorphous silicon disposed on a portion of the second gate electrode 108 (i.e., one end of the second gate electrode 108) and the connection electrode 110 may be removed. Accordingly, the portion of the second gate electrode 108 and the connection electrode 110 may be exposed.

Figure 6C:
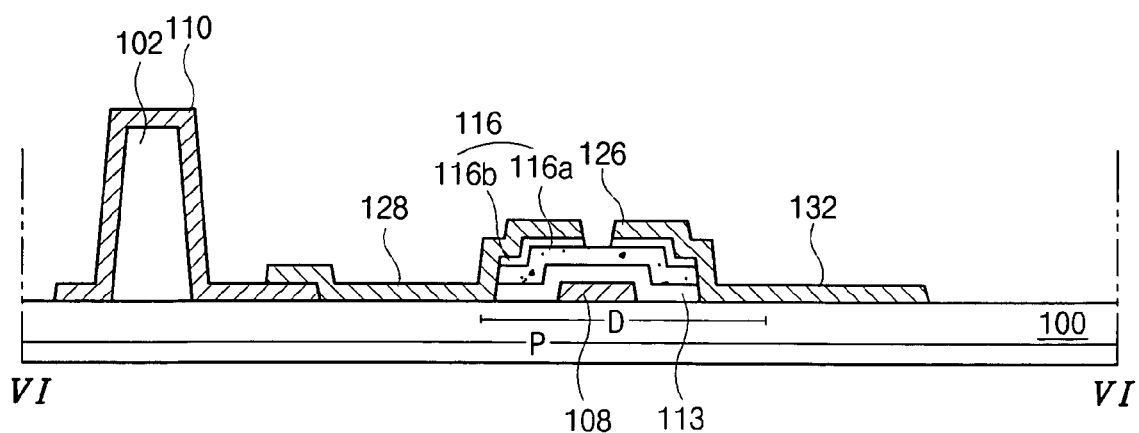

In FIGS. 5C and 6C, a second metal may be deposited on the substrate 100 having the semiconductor patterns 114 and 116. Then, the second metal may be patterned using a fourth mask process to form a data line 130, first and second source electrodes 122 and 126, first and second drain electrodes 124 and 128, and a power line 132. Accordingly, the first drain electrode 124 may contact the exposed portion of the second gate electrode 108. In addition, the second drain electrode 128 may overlap and contact a portion of the connection electrode 110, i.e., one side of the connection electrode 110, and the second source electrode 126 may extend from the power line 132.

For example, the second metal may be made of one of aluminum (Al), aluminum alloy including aluminum neodymium (AlNd), tungsten (W), copper (Cu), molybdenum (Mo), molybdenum tungsten (MoW), tantalum (Ta), chromium (Cr), and titanium (Ti). During the fourth mask process, the first source and drain electrodes 122 and 124, and the second source and drain electrodes 126 and 128 may function as first and second etching masks, respectively. Accordingly, a portion of the first ohmic contact layer 114b corresponding to a first region between the first source and drain electrodes 122 and 124 may be removed, and a portion of the second ohmic contact layer 116b corresponding to a second region between the second source and drain electrodes 126 and 128 may be removed.

Figure 6D:
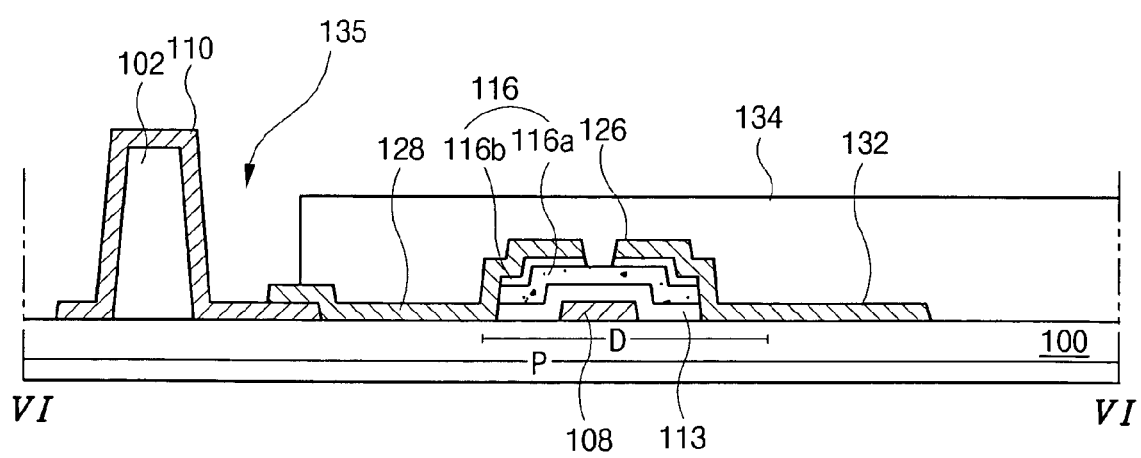

In FIGS. 5D and 6D, a passivation layer 134 may be formed on the substrate 100 having the data line 130. Then, the passivation layer 134 may be patterned using a fifth mask process to form an opening 135 to expose the connection electrode 110. The passivation layer 134 may be made of an inorganic insulating material, such as silicon nitride ($SiN_x$) and silicon oxide ($SiO_2$), or may be made of an organic insulating material, such as benzocyclobutene (BCB) and acrylic material(s).

Figure 7:
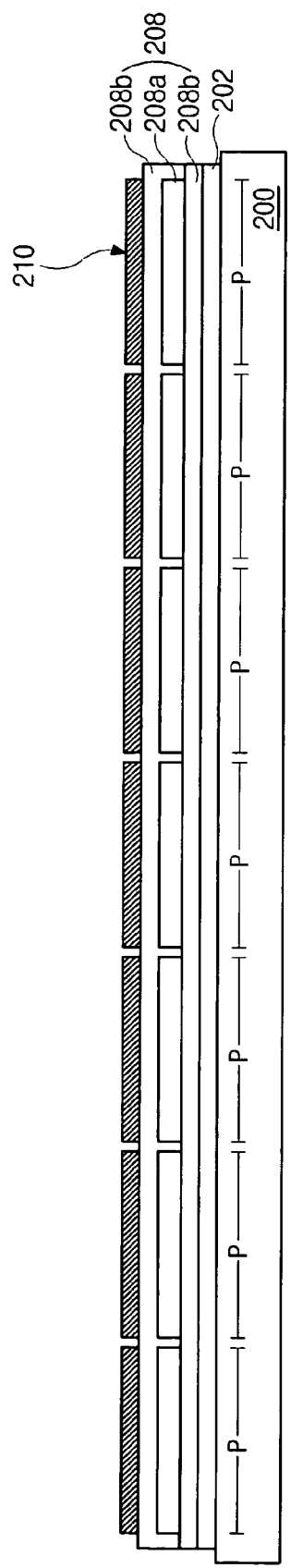
FIG. 7 is a cross sectional view of an exemplary emitting substrate for an OELD device according to the present invention.

FIG. 7 is a cross sectional view of an exemplary emitting substrate for an OELD device according to the present invention. In FIG. 7, a first electrode 202 of a transparent conductive material may be formed along an entire surface of a substrate 200. Next, an organic emitting layer 208 may be formed on the first electrode 202. For example, the organic emitting layer 208 may sequentially include a hole injection layer 208b, an emitting material layer 208a, and an electron injection layer 208c. Forming the emitting material layer 208a may include forming red (R), green (G), and blue (B) emitting material layers 208a within each of the corresponding pixel regions P. The red (R), green (G), and blue (B) emitting material layers 208a may be formed using a patterning process of red, green, and blue organic emitting materials. Next, a second electrode 210 of a opaque conductive material may be formed on the organic emitting layer 208, wherein the second electrode 210 may be formed within each of the pixel regions P.

FIGS. 8A to 8D are cross sectional views of an exemplary method of fabricating an array substrate for an OELD device according to the present invention, and FIGS. 9A to 9D are cross sectional views of an exemplary method of fabricating an array substrate for an OELD device according to a the present invention. In FIGS. 8A to 8D and 9A to 9D, the OELD device may be similar to the exemplary OELD device of FIGS. 5A to 5D and 6A to 6D, except for stacking structures of a connection electrode. Accordingly, detailed explanation of elements similar to elements in FIGS. 5A to 5D and 6A to 6DF have be omitted for the sake of brevity.

Figure 8A:
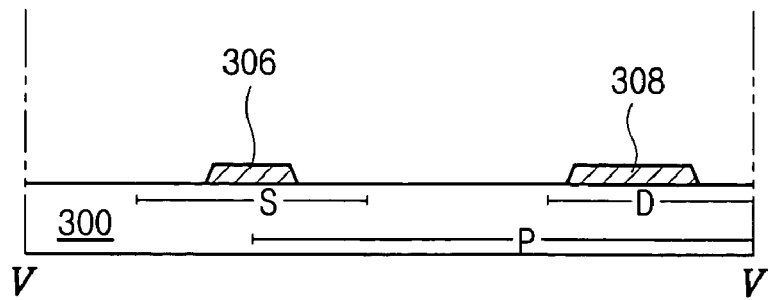
FIGS. 8A to 8D are cross sectional views of an exemplary method of fabricating an array substrate for an OELD device according to the present invention.
Figure 9A:
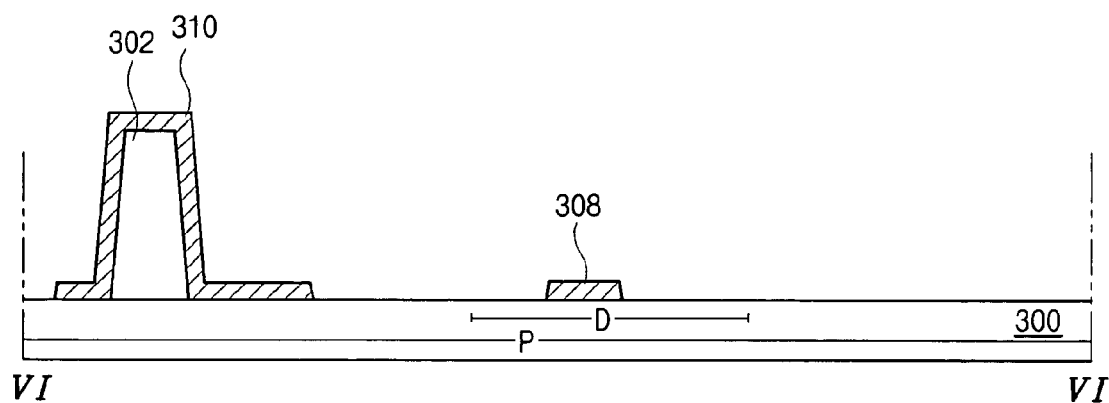
FIGS. 9A to 9D are cross sectional views of an exemplary method of fabricating an array substrate for an OELD device according to a the present invention.

In FIGS. 8A and 9A, the dummy pattern 302 may be formed on a substrate 300 using a first mask process. Then, a gate line 104 (in FIG. 4), first and second gate electrodes 306 and 308, and a first connection electrode 310 may be formed using a second mask process. For example, the first connection electrode 310 in FIGS. 9A to 9D may correspond to the connection electrode 110 (in FIGS. 5A to 5D).

Figure 8B:
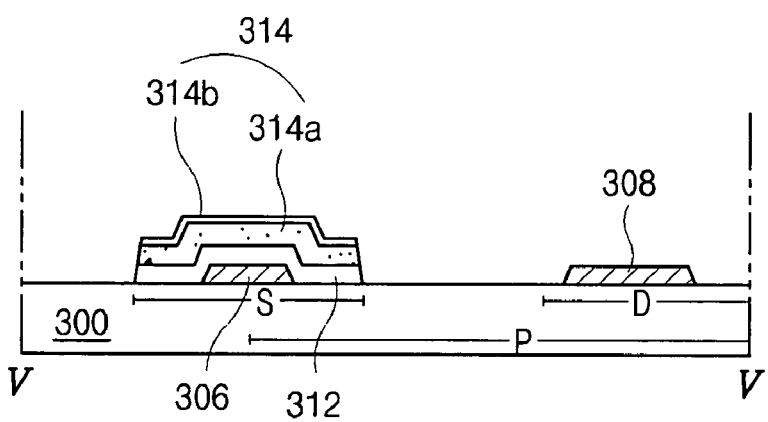
Figure 9B:
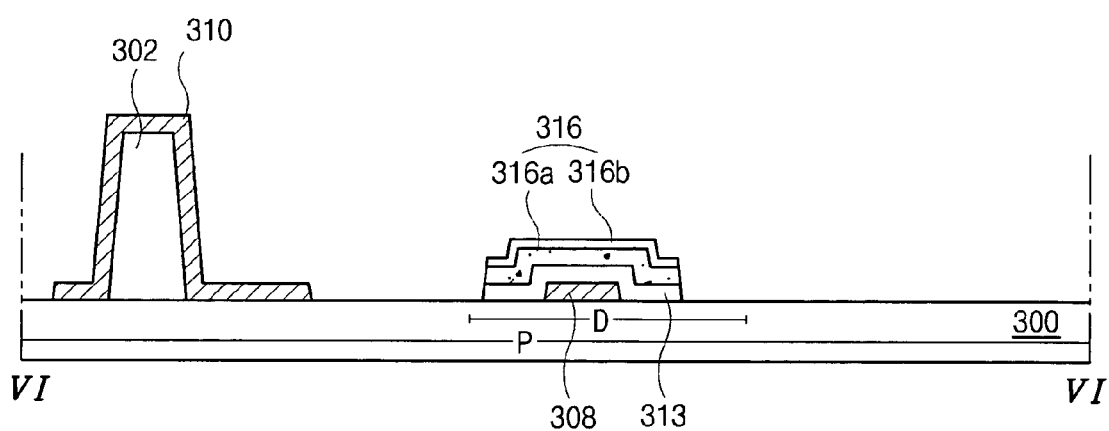

In FIGS. 8B and 9B, first and second semiconductor patterns 314 and 316, and first and second gate insulating patterns 312 and 313 may be formed using a third mask process.

Figure 8C:
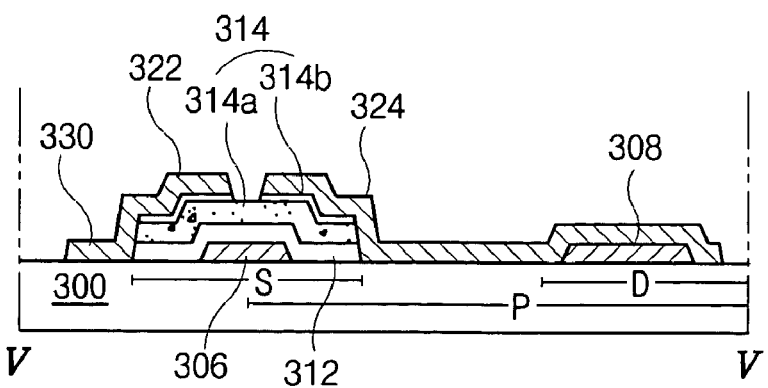
Figure 9C:
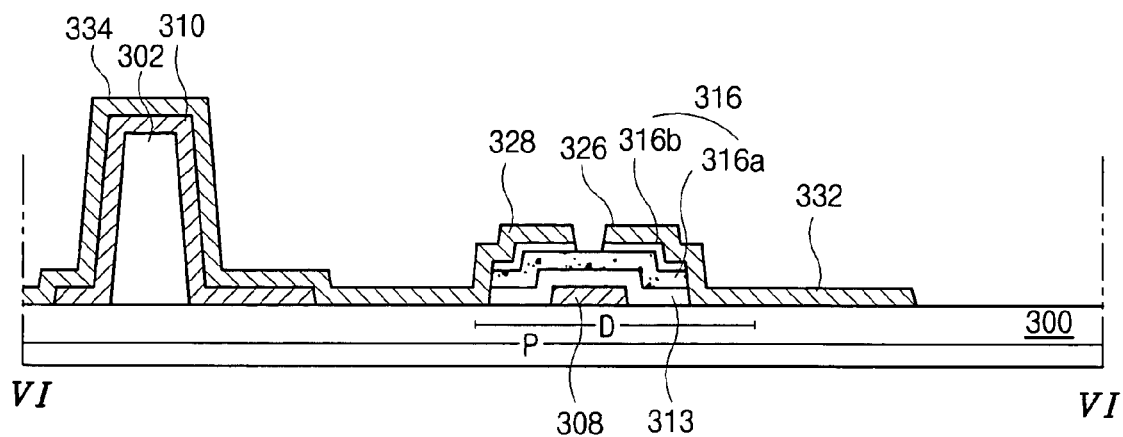

In FIGS. 8C and 9C, a data line 330, first and second source electrodes 322 and 326, first and second drain electrodes 324 and 328, a power line 332, and a second connection electrode 334 may be formed using a fourth mask process. The second connection electrode 334 may extend from the second drain electrode 328 and may cover and contact the first connection electrode 310.

Figure 8D:
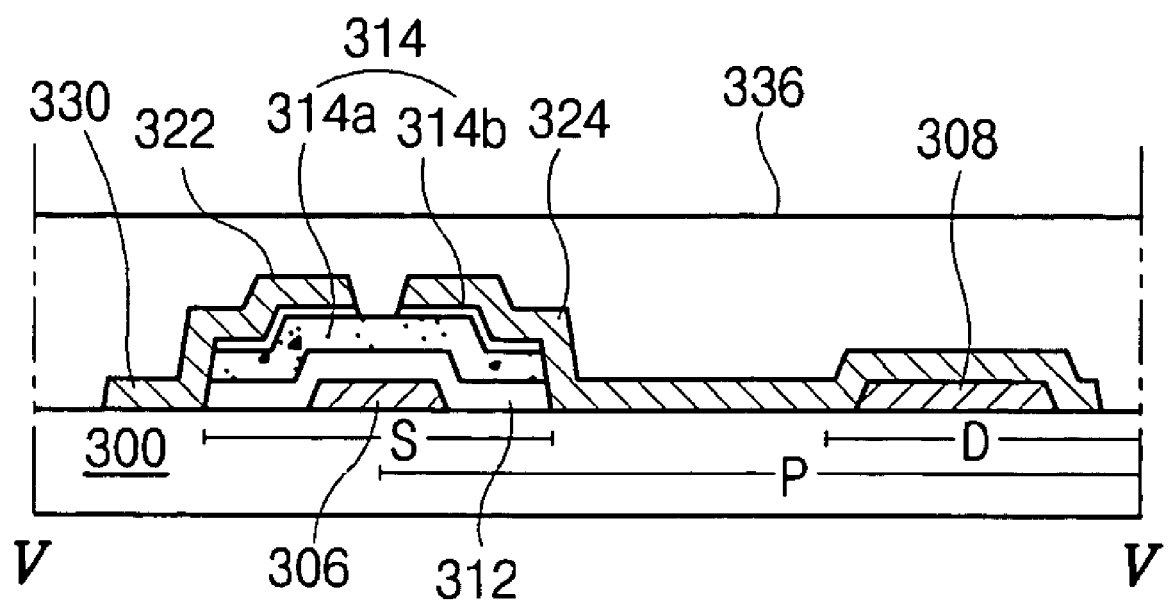
Figure 9D:
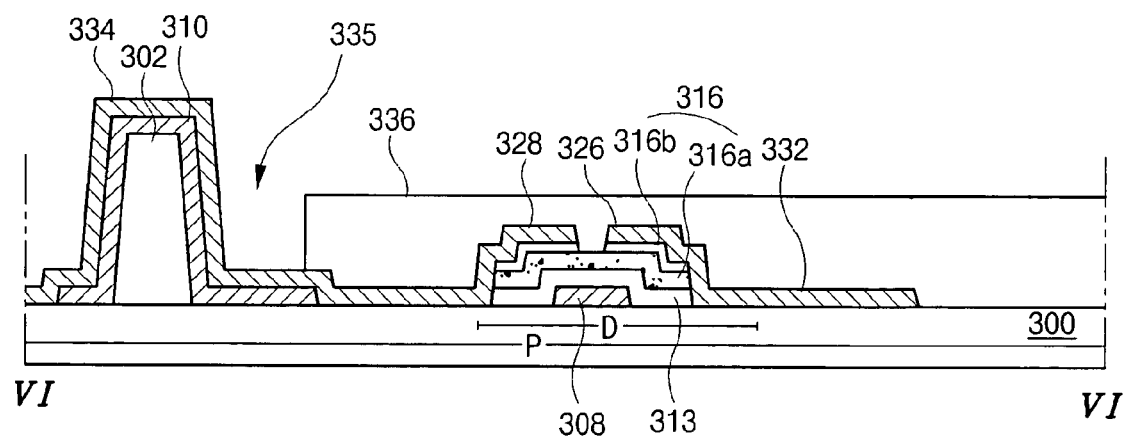

In FIGS. 8D and 9D, a passivation layer 334 having an opening 335 may be formed using a fifth mask process. The opening 335 may expose the connection electrodes 310 and 334.

According to the present invention, a transistor and an organic emitting diode may be respectively formed on different substrates. Thus, production efficiency of an OELD device may be increased. Furthermore, according to the present invention, since a first electrode may be formed of a transparent material, light emitted from an organic emitting layer may be transitted through an emitting substrate, i.e., an upper substrate, and thus the OELD device may function as a top emission-type OELD device. Thus, aperture ratio may be improved, and high resolution may be achieved.

According to the present invention, an array substrate having a dummy pattern and a connection electrode may be fabricated using five mask processes. Thus, additional fabrication processes may not be necessary, and thus production time and costs may be reduced.

It will be apparent to those skilled in the art that various modifications and variations can be made in the OELD device and method fabricating an OELD device without departing from the spirit or scope of the invention. Thus, it is intended that the present invention cover the modifications and variations of this invention provided they come within the scope of the appended claims and their equivalents.

What is claimed is:

1. An electroluminescent display device, comprising:
   first and second substrates facing each other;
   data and gate lines crossing each other on the first substrate to define a plurality of pixel regions;
   a switching transistor connected to the gate and data lines;
   a driving transistor connected to the switching transistor;
   a dummy pattern on the first substrate;
   a connection electrode on the dummy pattern and connected to the driving transistor;
   a power line connected to the driving transistor; and
   an emitting diode on the second substrate and connected to the connection electrode.

2. The device according to claim 1, wherein the switching transistor includes a first gate electrode, a first source electrode, and a first drain electrode, and the driving transistor includes a second gate electrode, a second source electrode, and a second drain electrode.

3. The device according to claim 2, wherein the second drain electrode overlaps and contacts the connection electrode.

4. The device according to claim 3, wherein the second drain electrode covers the connection electrode.

5. The device according to claim 2, wherein the connection electrode includes first and second connection electrodes, and the second connection electrode extends from the drain electrode.

6. The device according to claim 2, wherein the first drain electrode contacts a portion of the second gate electrode.

7. The device according to claim 1, further comprising a passivation layer having an opening that exposes the connection electrode.

8. The device according to claim 2, further comprising first and second semiconductor patterns corresponding to the first and second gate electrodes, respectively, a first gate insulating pattern disposed between the first gate electrode and the first semiconductor pattern, and a second gate insulating pattern disposed between the second gate electrode and the second semiconductor pattern.

9. The device according to claim 8, wherein the first and second insulating patterns having substantially the same shape along a same plane as the first and second semiconductor patterns, respectively.

10. The device according to claim 1, wherein the dummy pattern includes an acrylic material.

11. The device according to claim 1, wherein the emitting diode includes a first electrode, an organic emitting layer, and a second electrode sequentially disposed on the second substrate.

12. The device according to claim 11, wherein the first electrode includes one of indium-tin-oxide (ITO) and indium-zinc-oxide (IZO).

13. The device according to claim 11, wherein the second electrode is made of an opaque conductive material including one of calcium (Ca), aluminum (Al), and magnesium (Mg).

14. The device according to claim 11, wherein the first electrode has a work function greater than a work function of the second electrode.

15. The device according to claim 11, wherein the organic emitting layer includes an emitting material layer, a hole injection layer between the first electrode and the emitting material layer, and an electron injection layer between the second electrode and the emitting material layer.

16. The device according to claim 11, wherein the second electrode is disposed within each of the pixel regions.

17. The device according to claim 15, wherein the emitting material layer is disposed within each of the pixel regions.

18. The device according to claim 1, further comprising a sealant disposed between the first and second substrates along periphery portions of the first and second substrates.

19. The device according to claim 1, wherein the connection electrode covers the dummy pattern.

20. A method of fabricating an electroluminescent display device, comprising:
   forming a dummy pattern on a first substrate;
   forming a gate line, first and second gate electrodes, and a first connection electrode formed on the dummy pattern;
   forming first and second insulating patterns on the first and second gate electrodes on the first substrate, respectively;
   forming first and second semiconductor patterns on the first and second insulating patterns, respectively;
   forming a data line crossing the gate line to define a pixel region, a power line, a first source electrode, and a first drain electrode on the first semiconductor pattern, and a second source electrode and a second drain electrode on the second semiconductor pattern, the first drain electrode contacts the second gate electrode and the second drain electrode contacts the connection electrode;
   forming a passivation layer having an opening to expose the first connection electrode;
   forming an emitting diode on a second substrate; and
   attaching the first and second substrates together.

21. The method according to claim 20, wherein the second drain electrode overlaps the first connection electrode.

22. The method according to claim 20, wherein the second drain electrode covers the first connection electrode.

23. The method according to claim 20, further comprising forming a second connection electrode to extend from the second drain electrode and on the first common electrode.

24. The method according to claim 20, wherein the first and second semiconductor patterns, and the first and second insulating patterns are simultaneously patterned during the same process.

25. The method according to claim 20, wherein a portion of the second gate electrode is exposed during the forming processes of the first and second semiconductor patterns and the first and second insulating patterns, and the exposed portion of the second gate electrode contacts the first drain electrode.

26. The method according to claim 20, wherein the dummy pattern includes an acrylic material.

27. The method according to claim 20, wherein forming the emitting diode includes:

forming a first electrode on the second substrate;

forming an organic emitting layer on the first electrode; and forming a second electrode on the organic emitting layer.

28. The method according to claim 27, wherein the first electrode includes one of indium-tin-oxide (ITO) and indium-zinc-oxide (IZO).

29. The method according to claim 27, wherein the second electrode is made of an opaque conductive material including one of calcium (Ca), aluminum (Al), and magnesium (Mg).

30. The method according to claim 27, wherein the first electrode has a work function greater than a work function of the second electrode.

31. The method according to claim 27, wherein forming the organic emitting layer includes:

forming a hole injection layer on the first electrode;

forming an emitting material layer on the hole injection layer; and forming an electron injection layer on the emitting material layer.

32. The method according to claim 27, wherein the second electrode is formed within the pixel region.

33. The method according to claim 31, wherein the emitting material layer is formed within the pixel region.

34. The method according to claim 20, wherein attaching the first and second substrates includes a sealant formed along peripheral portions of the first and second substrates.

35. The method according to claim 20, wherein the first electrode covers the dummy pattern.

* * * * *